United States Patent
Chen et al.

(10) Patent No.: US 9,953,915 B2
(45) Date of Patent: Apr. 24, 2018

(54) ELECTRICALLY CONDUCTIVE INTERCONNECT INCLUDING VIA HAVING INCREASED CONTACT SURFACE AREA

(71) Applicant: International Business Machines Corporation, Armonk, NY (US)

(72) Inventors: Hsueh-Chung Chen, Cohoes, NY (US); James J. Demarest, Rensselaer, NY (US); Sean Teehan, Rensselaer, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/364,634

(22) Filed: Nov. 30, 2016

(65) Prior Publication Data
US 2017/0084534 A1 Mar. 23, 2017

Related U.S. Application Data

(62) Division of application No. 14/533,636, filed on Nov. 5, 2014, now Pat. No. 9,553,044.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76843* (2013.01);
(Continued)

(58) Field of Classification Search
CPC ........... H01L 23/5226; H01L 21/76816; H01L 21/76843; H01L 23/53238; H01L 23/5283;
(Continued)

(56) References Cited

U.S. PATENT DOCUMENTS 9,553,044 B2    1/2017 Chen
2010/0081272 A1*  4/2010 Jang ................. H01L 21/76804
                                                         438/637

(Continued)

OTHER PUBLICATIONS

List of IBM Patents or Patent Applications Treated as Relates; (Appendix P), Filed Mar. 17, 2017; 2 pages.

*Primary Examiner* — Jay C Chang
*Assistant Examiner* — Charles R Peters
(74) *Attorney, Agent, or Firm* — Cantor Colburn LLP; Vazken Alexanian

(57) ABSTRACT

An interconnect structure includes a first dielectric layer and a second dielectric layer each extending along a first axis to define a height and a second axis opposite the first axis to define a length. A capping layer is interposed between the first dielectric layer and the second dielectric layer. At least one electrically conductive feature is embedded in at least one of the first dielectric layer and the second dielectric layer. At least one electrically conductive via extends through the second dielectric layer and the capping layer. The via has an end that contacts the conductive feature. The end includes a flange having at least one portion extending laterally along the first axis to define a contact area between the via and the at least one conductive feature.

18 Claims, 7 Drawing Sheets

(51) Int. Cl.
    *H01L 23/532*  (2006.01)
    *H01L 23/528*  (2006.01)
(52) U.S. Cl.
    CPC ...... *H01L 23/5283* (2013.01); *H01L 23/5329* (2013.01); *H01L 23/53223* (2013.01); *H01L 23/53238* (2013.01); *H01L 23/53266* (2013.01); *H01L 23/53295* (2013.01); *H01L 2924/0002* (2013.01)
(58) Field of Classification Search
    CPC ......... H01L 23/53223; H01L 23/53266; H01L 23/53295; H01L 23/5329; H01L 2924/0002
    See application file for complete search history.

(56) References Cited

U.S. PATENT DOCUMENTS

| | | | |
|---|---|---|---|
| 2013/0113102 A1* | 5/2013 | Bao | H01L 21/76846 257/751 |
| 2016/0027729 A1* | 1/2016 | Chen | H01L 23/5226 257/741 |

* cited by examiner

ELECTRICALLY CONDUCTIVE INTERCONNECT INCLUDING VIA HAVING INCREASED CONTACT SURFACE AREA

DOMESTIC PRIORITY

This application is a divisional of U.S. patent application Ser. No. 14/533,636, filed Nov. 5, 2014, the disclosure of which is incorporated by reference herein in its entirety.

BACKGROUND

The present invention relates generally to electrically conductive interconnects, and more specifically, to an electrically conductive interconnect having an increased contact surface area.

Semiconductor devices can include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure are typically formed from copper (Cu) since copper-based interconnects provide higher speed signal transmission between large numbers of transistors on a complex semiconductor chip as compared with aluminum-based interconnects.

Within a typical dual damascene interconnect structure, for example, metal vias run perpendicular to the semiconductor substrate (e.g., the substrate thickness) and metal lines run parallel to the semiconductor substrate (e.g., the substrate length). Typically, the metal vias are present beneath the metal lines and both features are embedded within a dielectric material. Although various methods of forming such dual damascene interconnect structures are known, further improvements are needed to provide interconnect structures that provide greater speeds due to lower resistance, and are highly reliable.

SUMMARY

According to at least one embodiment of the present invention, an interconnect structure comprises a multiple dielectric layers extending along a first axis (perpendicular to the horizontal plane) to define a height and a second axis perpendicular to the first axis (parallel to the horizontal plane) to define a length. A capping layer is interposed between a first dielectric layer and a second dielectric layer. At least one electrically conductive feature is embedded in the first and/or the second dielectric layers. At least one electrically conductive via extends through the second dielectric layer and the capping layer to physically contact the conductive feature in the first dielectric layer. The via includes an end having a contact flange that contacts the at least one electrically conductive feature. The flange has at least one portion extending laterally along the second axis to define a contact area between the via and the at least one conductive element.

According to another embodiment, a method of fabricating an interconnect structure comprises forming multiple dielectric layers that extend along a first axis to define a height and a second axis perpendicular to the first axis to define a length. A capping layer is interposed between a first dielectric layer and the second dielectric layer. The first dielectric layer and/or the second dielectric layer includes at least one electrically conductive feature embedded therein. The method further includes etching the second dielectric layer to form an opening that extends laterally with respect to the second axis to define at least one cavity beneath the second dielectric layer. The method further includes depositing an electrically conductive material in the opening and the at least one cavity to form an electrically conductive via. The via includes a flange having at least one portion extending laterally from the first axis (i.e., parallel with the second axis) and away from the via to define a contact area between the via and the at least one conductive element.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. FIGS. 1-6B are a series of views illustrating a process flow of forming an interconnect structure according to non-limiting embodiments of the invention, in which:

FIG. 1 is a cross-sectional view of an initial multilevel interconnect structure including a lower interconnect level comprising a first dielectric material, a capping layer formed on the interconnect level, and an upper interconnect level comprising a second dielectric material formed on the capping layer;

FIG. 2 illustrates the interconnect structure shown in FIG. 1 following a first etching process that forms an opening in the second dielectric material while stopping on a capping layer;

FIG. 3 illustrates the interconnect structure shown in FIG. 2 following a second etching process that forms a trench in the capping layer and stops on a conductive feature formed in the first dielectric material;

FIG. 4 illustrates the interconnect structure shown in FIG. 3 after depositing a conformal metal film layer on the etched surfaces of the second dielectric material and on the conductive feature;

FIG. 5 illustrates the interconnect structure shown in FIG. 4 after depositing a metal material on the conformal metal film layer to fill the opening and the trench to form an electrically conductive via;

FIG. 6B illustrates the interconnect structure including a final via formed therein according to another embodiment.

DETAILED DESCRIPTION

Various embodiments of the invention provide an interconnect structure comprising an electrically conductive via including a contact flange formed on one end thereof. The contact flange increases the electrical contact area between the via and a conductive feature embedded in a dielectric layer of the interconnect structure. The increased electrical contact area reduces the electrical resistance between the conductive feature and the contact flange, which in turn increases the overall thermal stability of the interconnect structure. In addition, one or more portions of the contact flange may be disposed beneath a portion of the dielectric layer. In this manner, the contact flange improves the overall mechanical strength of the via while still maintaining the increased contact area.

Figure 1:
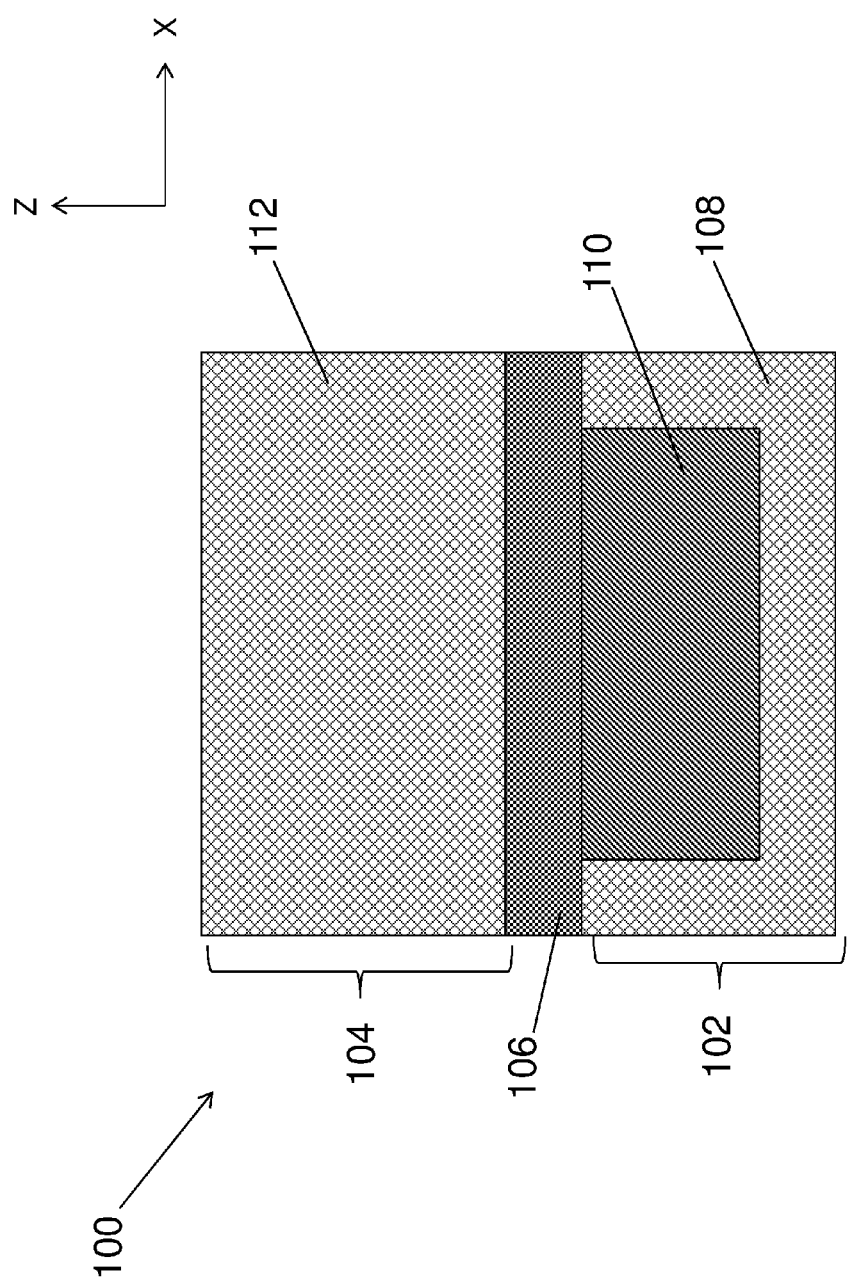

FIGS. 1-6B are a series of views illustrating a process flow of forming an interconnect structure according to non-limiting embodiments of the invention. With reference to FIG. 1, an initial interconnect structure 100 is illustrated according to a non-limiting embodiment. According to an embodiment, the interconnect structure 100 is formed as a multilevel interconnect structure 100 extending along a first axis (Z-axis) to define a height (i.e., thickness) and a second axis (X-axis) to define a length. The interconnect structure 100 includes a lower interconnect level 102 and an upper interconnect level 104. The lower interconnect level 102 and the upper interconnect level 104 are separated from one another by a capping layer 106.

The first interconnect level 102 includes a first layer 108 comprising a first dielectric material such as, for example, silicon dioxide ($SiO_2$), or low-k dielectric material. It is appreciated, however, that other dielectric materials may be used. For example, either inorganic dielectrics or organic dielectrics may be used. The first dielectric material may also be porous or non-porous. The thickness of the first layer 108 may vary depending upon the dielectric material and/or the desired application of the interconnect structure 100. According to a non-limiting embodiment, the first layer 108 has a thickness ranging from about 20 nanometers (nm) to about 450 nm, for example.

The lower interconnect level 102 further includes one or more conductive features 110 embedded in the first layer 108. The conductive feature 110 comprises an electrically conductive material including, but not limited to, copper (Cu), tungsten (W), aluminum (Al), or metal alloys such as, for example, such as an aluminum copper (AlCu) alloy. The conductive feature 110 can be formed using various processing techniques understood by one of ordinary skill in the art. According to an embodiment, a barrier film (not shown) may be interposed between the first layer 108 and the conductive feature 110. In this manner, conductive material/ions are inhibited from diffusing into the first layer 110 as understood by one of ordinary skill in the art.

The upper interconnect level 104 includes a second layer 112 formed on an upper surface of the capping layer 106. In this manner, the capping layer 106 is interposed between the first layer 108 and the second layer 112. The second layer 112 comprises a second dielectric material that is the same or different as that of the first dielectric material of the first layer 108. According to a non-limiting embodiment, the second layer 112 comprises ($SiO_2$), or a low-k dielectric material. The processing techniques and thickness ranges for the first layer 108 are also applicable to the second layer 112.

The capping layer 106 is formed on the upper surface of the first layer 108 according to a conventional deposition process including, but not limited to, chemical vapor deposition (CVD), plasma-enhanced chemical vapor deposition (PECVD, and chemical solution deposition (CSD). The capping layer 106 may comprises any suitable dielectric capping material such as, for example, silicon carbide (SiC), silicon nitride ($Si_3N_4$), tetrasilicon ammonia ($Si_4NH_3$), silicon oxide ($SiO_2$), a carbon doped oxide, a nitrogen and hydrogen doped silicon carbide SiC(N,H) or combinations thereof. The thickness of the capping layer 106 may vary depending on the technique used to form the same as well as the material make-up of the layer. According to an embodiment, the capping layer 106 has a thickness ranging from approximately 5 nm to approximately 55 nm.

Figure 2:
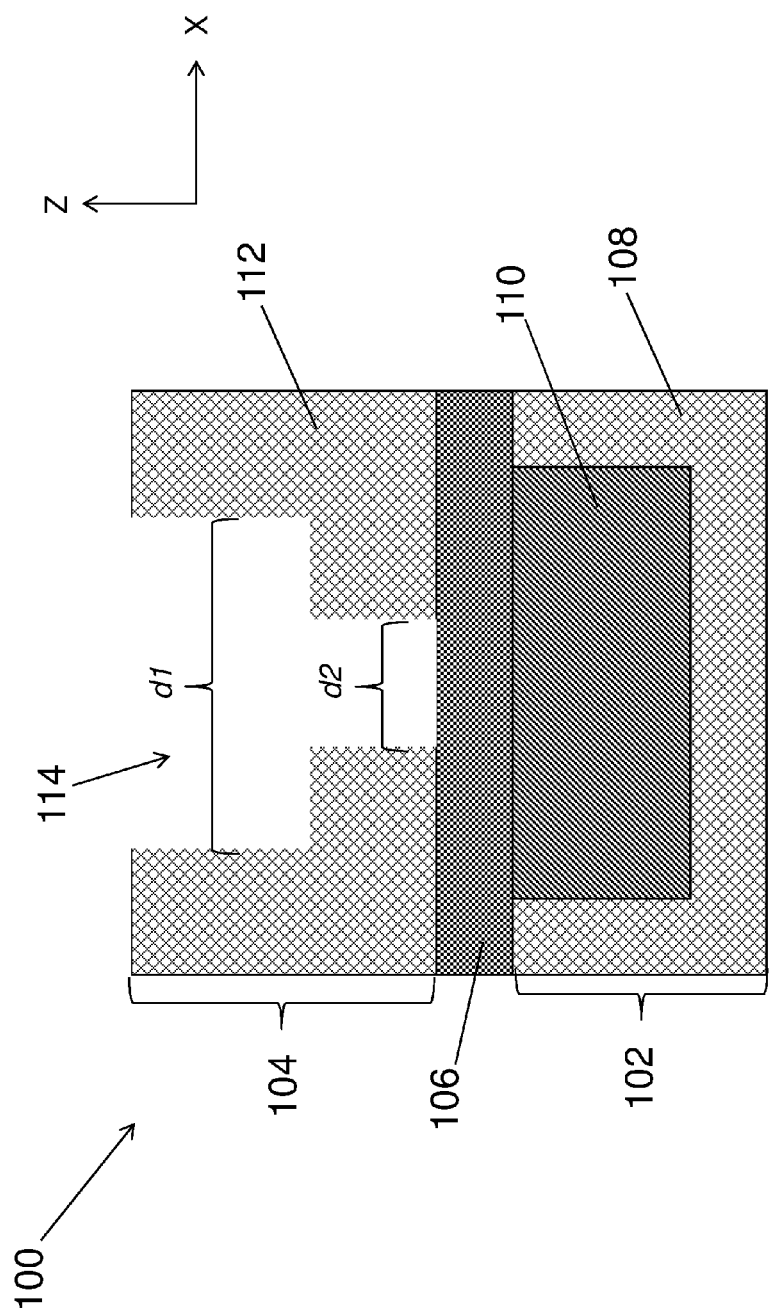

Turning to FIG. 2, one or more etching processes are performed to from an opening 114 in the second layer 112. The etching process used to form the opening 114 is selective to the second material of the second layer and stops on the capping layer 106. According to an embodiment, the opening 114 includes a wider upper opening having a first distance (d1) and a narrower lower opening having second distance (d2) that is less than the first distance (d1). A combination of etchings processes and various masking techniques as understood by one of ordinary skill in the art may be used to form the upper and lower openings. The etching process used to form the opening 114 includes, but are not limited to, a dry etching process, a wet chemical etching process or a combination thereof. The dry etching processes may include, for example, reactive-ion etching, ion beam etching, plasma etching, or laser ablation. A fluoride-based etching chemistry, for example, may be used to form the opening 114.

Figure 3:
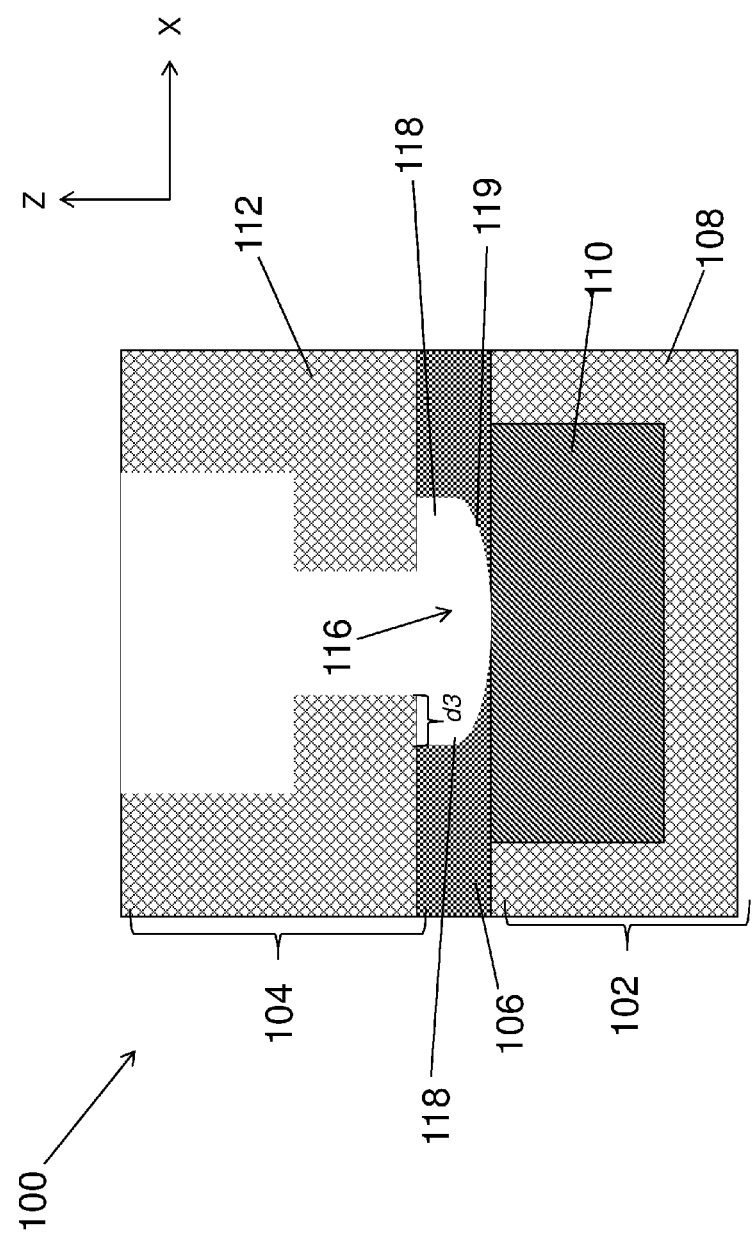

Turning now to FIG. 3, the capping layer 106 is illustrated having a trench 116 formed therein following a combined dry-wet etching process. The combined dry-wet etching process is selective to the dielectric materials of the second layer 112 and the capping layer 106. According to an embodiment, the etching process may include a first reactive ion etching (RIE) process that etches through the capping layer 106 while stopping on the upper surface of the conductive feature 110, followed by a second isotropic etching process that etches the capping layer 106 in a lateral direction (e.g., along the X-axis) to form cavities 118 that extend laterally beyond the second layer 112. According to an embodiment, the cavities 118 may extend from the opening 114 into the capping layer 106 at a distance (d3) ranging from approximately 2 nm to approximately 50 nm, for example. The isotropic etching process also forms a curved cavity portion 119 which promotes undercutting of the cavities 118 beneath the second layer 112.

Figure 4:
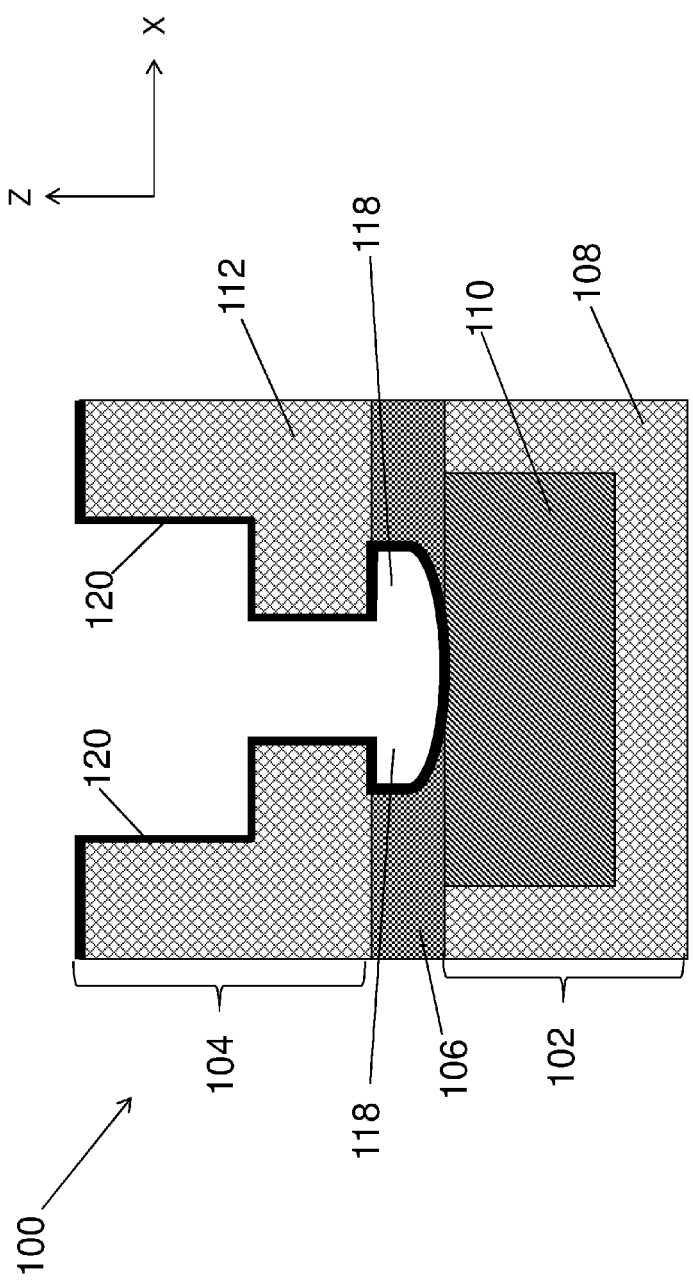

Turning to FIG. 4, a conformal metal film layer 120 is formed on the upper surface of the second layer 112, the inner walls of the opening 114 and trench 116, and the upper surface of the exposed conductive feature 110. The metal film layer 120 may act as a metal diffusion barrier that inhibits metal ions of a metal via (not shown in FIG. 4) from diffusing into the second layer 112 as understood by one of ordinary skill in the art. The metal film layer 120 comprises a metallic material including, but not limited to, cobalt (Co), tantalum (Ta), tantalum nitride (TaN), titanium (Ti), titanium nitride (TiN), Ruthenium (Ru), iridium (Ir), gold (Au), rhodium (Rh), platinum (Pt), palladium, (Pd), silver (Ag), or various alloys thereof. Various well-known deposition processes may be used to form the metal film layer 120 including, but not limited to, CVD, PECVD, CSD, atomic layer deposition (ALD), metallic sputtering, or metal plating (i.e., electro or electroless). The thickness of the metal film layer 120 may vary depending on the type of metallic material used as well as the deposition technique. According to an embodiment, the thickness of the metal film layer 120 can range from approximately 0.5 to approximately 40 nm.

Figure 5:
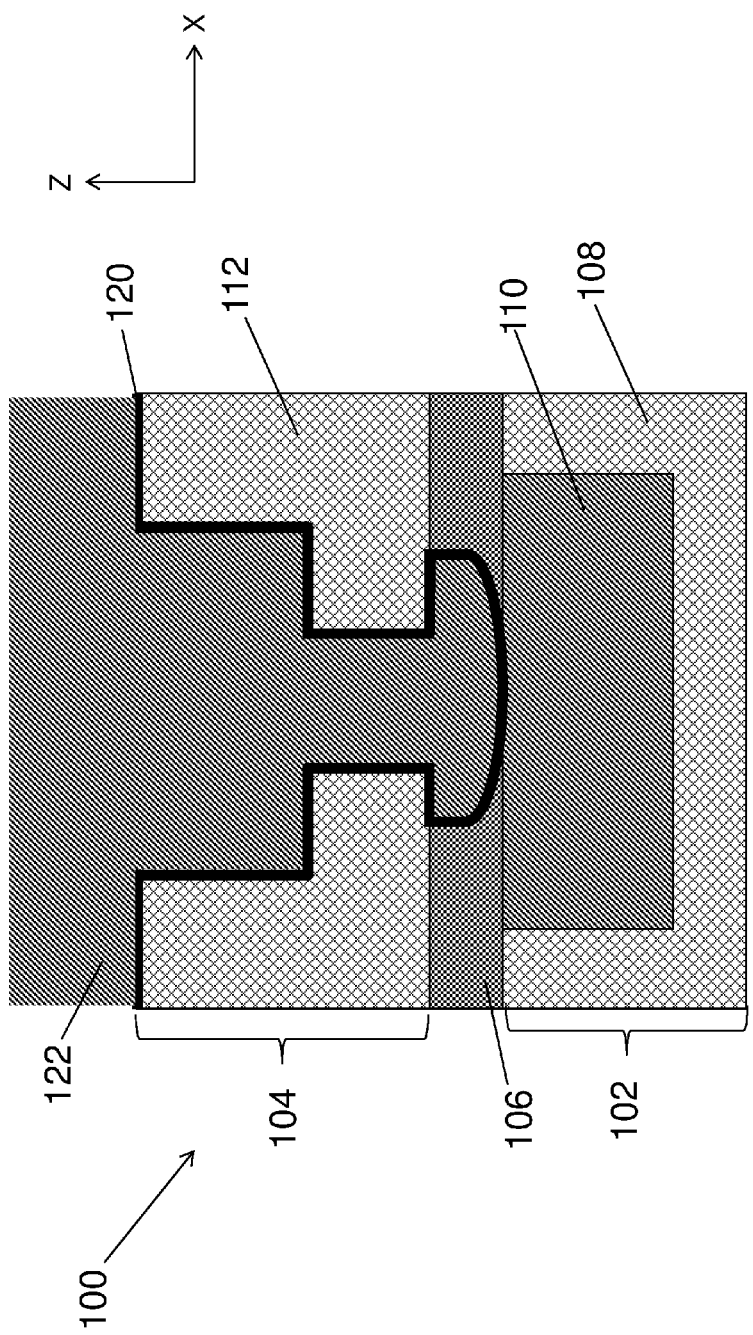

Referring to FIG. 5, the interconnect structure 100 is illustrated after depositing a conductive material 122 that fills the opening 114 and trench 116, and covers the upper surface of the second layer 112 such that the metal film layer is interposed therebetween. The conductive material 122 may comprise the same or different conductive material as that of the conductive feature 110. According to an embodiment, the conductive material 122 comprises copper (Cu), for example, and is deposited using the same deposition processing as described above in forming the conductive feature 110.

Figure 6A:
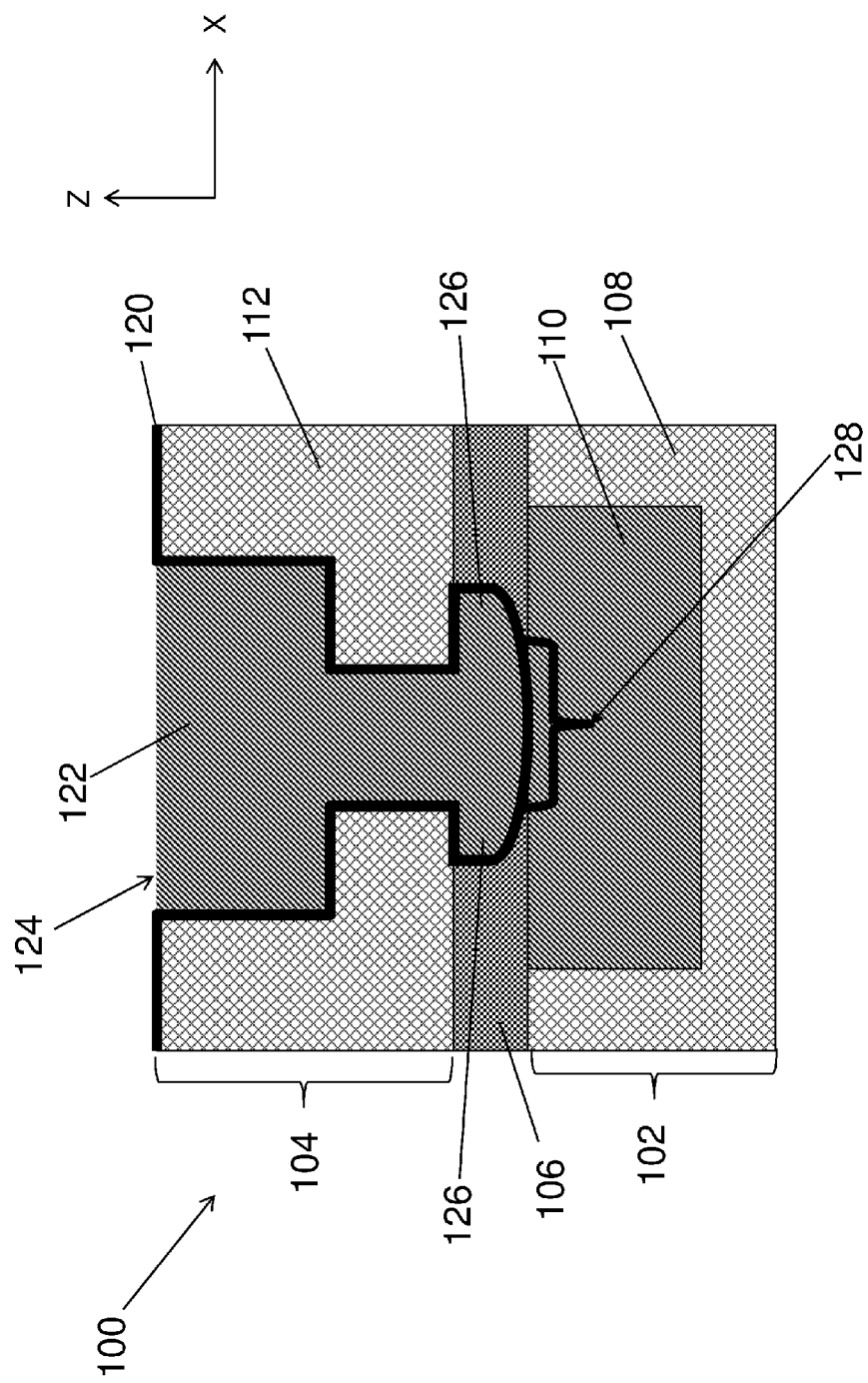
FIG. 6A illustrates the interconnect structure shown in FIG. 5 following a planarization process applied to an upper portion of the via stopping on the conformal metal film layer such that that metal material and the conformal metal film layer are flush with one another to form a final via.

Turning now to FIG. 6A, a final via 124 is formed in the interconnect structure 100 following a chemical-mechanical planarization (CMP). The CMP process planarizes the conductive material 122 and stops on the upper surface of the metal film layer 120. In this manner, the upper surface of the final via 124 is flush with the upper surface of the metal film layer 120. The final via 124 formed after preforming the CMP process is configured to establish electrical conductivity with the conductive feature 110 embedded in the first layer 108 as understood by one of ordinary skill in the art.

Figure 6B:
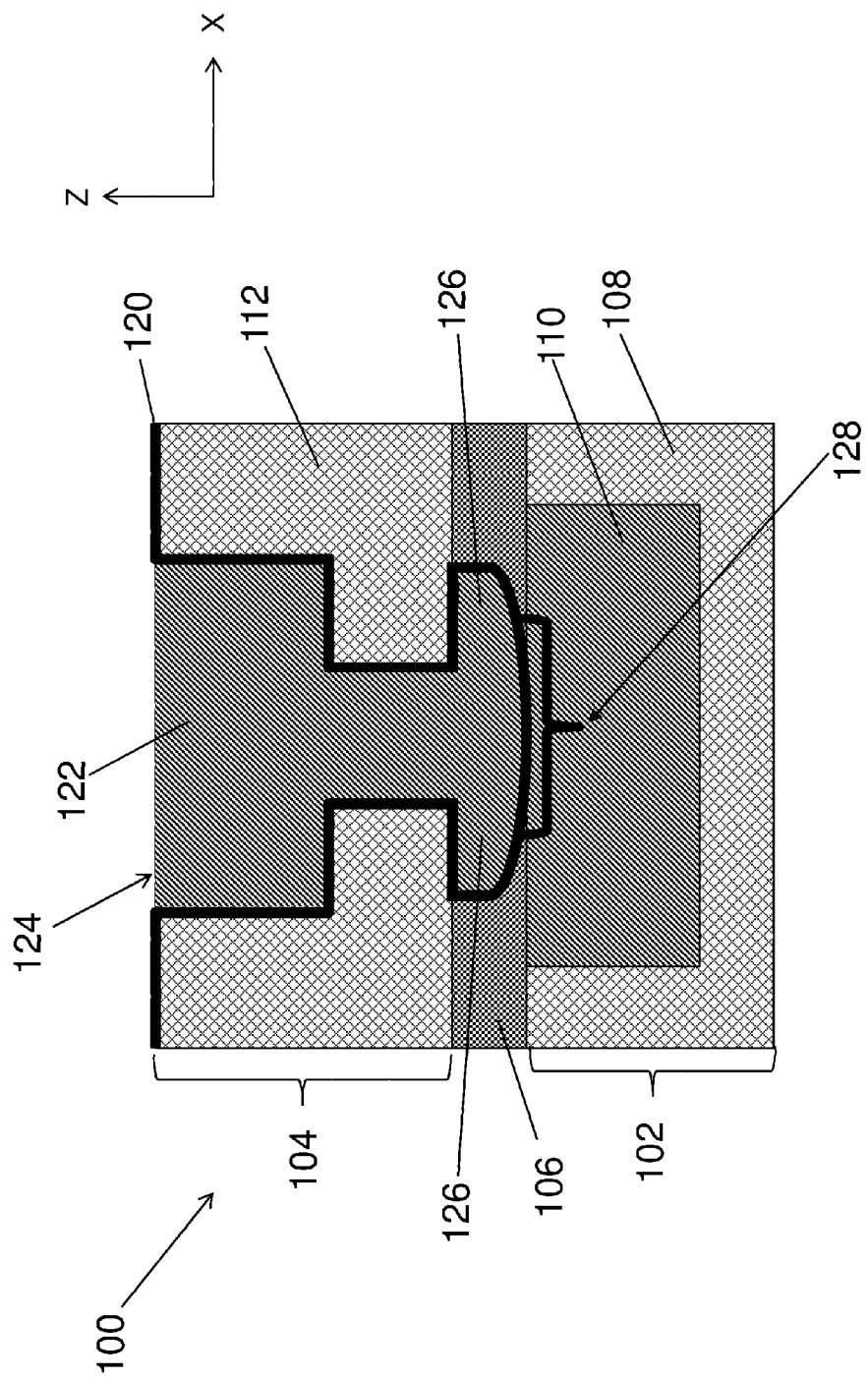

The final via 124 includes a contact flange 126 that extends laterally (e.g., in the X-direction) away from the final via 124 and across the upper surface of the conductive feature 110. The contact flange 126, therefore, forms an increased contact area 128 that extends across the upper surface of the conductive feature 110. The contact area 128 can have a size that exceeds d2 by approximately 10% to approximately 300%. As further illustrated in FIG. 6A, the increased contact area 128 is formed in the capping layer 106 without punching into the conductive feature 110. In this manner, the electrical resistance between the conductive feature 110 and the contact flange 126 is reduced, while maintaining the integrity of the underlying conductive feature 110. According to an embodiment, a portion of the contact area 128 may extend laterally beneath the second layer 112 and is aligned therewith as illustrated in FIG. 6B.

As further illustrated in FIG. 6A, one or more portions of the contact flange 126 also extend laterally (e.g., along the X-axis) beneath portions of the second layer 112. Although the conformal metal film 120 is illustrated as being interposed between an upper portion of the flange 126 and the second layer 112, it is appreciated that alternative embodiments of the invention may include disposing the flange 126 directly against the second layer 112. The contact flange 126, therefore, effectively anchors the via 124 to the second layer 112. In this manner, the contact flange 126 improves the stability of the via 124, especially in the vertical direction, e.g., the Z-axis direction, for example, to ensure the contact flange 126 remains in contact with the conductive element. Accordingly, the overall mechanical strength of the via 124 is improved while still maintaining the increased contact area 128 between the contact flange 126 and the conductive feature 110.

As described in detail above, at least one embodiment of the invention provides an interconnect structure 100 including a via 124 having a contact flange 126 formed on one end thereof. The contact flange 126 increases the electrical contact area 128 between the via 124 and the conductive feature 110 embedded in the first layer 110. The increased electrical contact area 128 reduces the electrical resistance between the conductive feature 110 and the contact flange 126, which in turn increases the overall thermal stability of the interconnect structure 100. In addition, one or more portions of the contact flange 126 may be disposed beneath a portion of the second layer 112. In this manner, the contact flange 126 improves the overall mechanical strength of the via 124 while still maintaining the increased contact area 128.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. An interconnect structure, comprising:
   a first dielectric layer and a second dielectric layer each extending along a first axis to define a height and a second axis opposite the first axis to define a length;
   a capping layer interposed between the first dielectric layer and the second dielectric layer, the capping layer including an upper surface formed directly against a lower surface of the second dielectric layer;
   at least one electrically conductive feature formed in at least one of the first dielectric layer and the second dielectric layer; and
   at least one electrically conductive via extending through the second dielectric layer and the capping layer, and having an end that contacts the at least one electrically conductive feature, the end including a narrow via portion and a contact flange, the narrow via portion extending parallel with respect to the first axis, the contact flange having at least one portion extending laterally away from the via along the second axis and perpendicular to the narrow via portion to define a contact area between the via and the at least one conductive feature, the contact area including an upper contact surface extending perpendicular to the narrow via portion, the upper contact surface extending parallel with the lower surface of the second dielectric layer to make contact therewith, the upper contact surface further being located completely beneath the lower surface of the second dielectric layer, wherein the contact area has a curve-shaped lower portion that directly contacts the at least one conductive feature and having a width extending along the second axis that is greater than a width of the narrow via portion extending along the second axis.

2. The interconnect structure of claim 1, wherein the contact flange is interposed between the first dielectric layer and the second dielectric layer.

3. The interconnect structure of claim 2, wherein the contact flange is formed in only the contact area without extending through the at least one conductive feature.

4. The interconnect structure of claim 3, wherein the contact area is formed in the capping layer without extending into the at least one conductive feature.

5. The interconnect structure of claim 4, wherein a portion of the contact flange is disposed against the second dielectric layer.

6. The interconnect structure of claim 5, further comprising a metal film layer on the via, the metal film layer configured to inhibit metal ions from diffusing into the first dielectric layer, the second dielectric layer and the capping layer.

7. The interconnect structure of claim 6, wherein the via and the at least one conductive feature comprise a metal material.

8. The interconnect structure of claim 7, wherein the capping layer comprises a dielectric material, and wherein the first and second dielectric layers comprises a low-k dielectric material different from the first dielectric material of the capping layer.

9. The interconnect structure of claim 8, wherein an upper surface of the via is flush with an upper surface of the metal film layer.

10. An interconnect structure, comprising:
a first dielectric layer and a second dielectric layer each extending along a first axis to define a height and a second axis opposite the first axis to define a length;
a capping layer interposed between the first dielectric layer and the second dielectric layer;
at least one electrically conductive feature formed in at least one of the first dielectric layer and the second dielectric layer; and
at least one electrically conductive via extending through the second dielectric layer and the capping layer, and having an end that contacts the at least one electrically conductive feature, the end including a narrow via portion and a contact flange, the narrow via portion extending parallel with respect to the first axis, the contact flange having at least one portion extending laterally away from the via along the second axis and perpendicular to the narrow via portion to define a contact area between the via and the at least one conductive feature, the contact area including a an upper contact surface extending perpendicular to the narrow via portion, the upper contact surface contacting the lower surface of the second dielectric layer, wherein the contact area has a curve-shaped lower portion that directly contacts the at least one conductive feature and having a width extending along the second axis that is greater than a width of the narrow via portion extending along the second axis, and wherein a portion of the contact area is aligned beneath the second dielectric layer.

11. The interconnect structure of claim 10, wherein the contact flange is interposed between the first dielectric layer and the second dielectric layer.

12. The interconnect structure of claim 11, wherein the contact flange is formed in only the contact area without extending through the at least one conductive feature.

13. The interconnect structure of claim 12, wherein the contact area is formed in the capping layer without extending into the at least one conductive feature.

14. The interconnect structure of claim 13, wherein a portion of the contact flange is disposed against the second dielectric layer.

15. The interconnect structure of claim 14, further comprising a metal film layer on the via, the metal film layer configured to inhibit metal ions from diffusing into the first dielectric layer, the second dielectric layer and the capping layer.

16. The interconnect structure of claim 15, wherein the via and the at least one conductive feature comprise a metal material.

17. The interconnect structure of claim 16, wherein the capping layer comprises a dielectric material, and wherein the first and second dielectric layers comprises a low-k dielectric material different from the first dielectric material of the capping layer.

18. The interconnect structure of claim 17, wherein an upper surface of the via is flush with an upper surface of the metal film layer.

* * * * *